(12) United States Patent
Maeng

(10) Patent No.: US 11,660,724 B2
(45) Date of Patent: May 30, 2023

(54) METHOD FOR MANUFACTURING A PAD CONDITIONER BY REVERSE PLATING AND PAD CONDITIONER MANUFACTURED THEREBY

(71) Applicant: Saesol Diamond Ind. Co., Ltd., Ansan-Si (KR)

(72) Inventor: Ju-Ho Maeng, Ansan-si (KR)

(73) Assignee: Saesol Diamond Ind. Co., Ltd., Ansan-Si (KR)

( * ) Notice: Subject to any disclaimer, the term of this patent is extended or adjusted under 35 U.S.C. 154(b) by 1123 days.

(21) Appl. No.: 16/259,628

(22) Filed: Jan. 28, 2019

(65) Prior Publication Data

US 2019/0232461 A1 Aug. 1, 2019

(30) Foreign Application Priority Data

Jan. 29, 2018 (KR) .......................... 10-2018-0010786

(51) Int. Cl.
*B24B 53/017* (2012.01)
*H01L 21/304* (2006.01)
*H01L 21/306* (2006.01)

(52) U.S. Cl.
CPC .......... *B24B 53/017* (2013.01); *H01L 21/304* (2013.01); *H01L 21/30625* (2013.01)

(58) Field of Classification Search
None
See application file for complete search history.

(56) References Cited

U.S. PATENT DOCUMENTS

| 2008/0053000 | A1* | 3/2008 | Palmgren | B24D 11/00 51/307 |
| 2009/0038234 | A1* | 2/2009 | Yen | B24D 18/00 451/443 |
| 2009/0239454 | A1* | 9/2009 | Yamashita | B24B 53/12 451/443 |
| 2010/0273402 | A1* | 10/2010 | Shimizu | B24B 53/017 451/443 |
| 2014/0302756 | A1* | 10/2014 | Sung | B24B 53/017 451/443 |

FOREIGN PATENT DOCUMENTS

KR 2002-0046471 A 6/2002

* cited by examiner

*Primary Examiner* — Stephanie P Duclair
(74) *Attorney, Agent, or Firm* — TraskBritt

(57) ABSTRACT

A manufacturing method of a pad conditioner by reverse plating is disclosed. The method comprises: forming a first plating layer on a temporary substrate to have multiple recesses; forming a second adhesive photosensitive film on the first plating layer; putting grains into the recesses; forming a first filling layer to support the grains; forming a second filling layer to support the grains; removing the second adhesive photosensitive film and forming a second boundary layer on the entire surface; forming a second plating layer on the second boundary layer; removing the temporary substrate and attaching a final substrate to the second plating layer; removing the first boundary layer and the first plating layer; removing the second boundary layer excluding a portion not exposed to the outside; and forming a third plating layer on an entire surface opposite to the final substrate to support the grains.

6 Claims, 6 Drawing Sheets

METHOD FOR MANUFACTURING A PAD CONDITIONER BY REVERSE PLATING AND PAD CONDITIONER MANUFACTURED THEREBY

PRIORITY CLAIM

This application claims the benefit under Article 8 of the Patent Cooperation Treaty to Korean Patent Application Serial No. KR 10-2018-0010786, filed Jan. 29, 2018, the disclosure of which is hereby incorporated herein in its entirety by this reference.

TECHNICAL FIELD

The present disclosure relates generally to a method for manufacturing a pad conditioner by reverse plating and a pad conditioner manufactured thereby. More particularly, the present disclosure relates to a method for manufacturing a chemical-mechanical polishing (CMP) pad conditioner and a CMP pad conditioner manufactured thereby, the pad conditioner being used for planarization of a wafer.

BACKGROUND

A chemical-mechanical polishing (CMP) apparatus is a polishing apparatus for planarization of a semiconductor wafer.

As illustrated in FIG. 1, in the basic operation of a CMP apparatus: a polishing pad 2 is attached to a platen 1; a carrier 3 holds a wafer 4 to be polished; a polishing slurry is continuously supplied on the polishing pad 2 while the carrier 3 holds and presses the wafer 4 against the polishing pad 2; and the platen 1 and the carrier 3 are moved relative to one another to polish the wafer 4.

Uniform polishing of a wafer is an important characteristic of a CMP apparatus for planarizing a semiconductor wafer. In addition, a surface state of the pad is one of the important factors for improving the uniform polishing of the wafer. However, as pressure and speed are increased during the polishing of the pad, the surface of the pad may be unevenly deformed over time, and pores on the pad may become clogged with polishing residues, thereby reducing the ability of the pad to uniformly polish the wafer.

Therefore, in the event that the surface of the pad becomes deformed, the deformed surface of the pad may be polished by performing conditioning in which the pad is polished using a conditioner 10 to develop new micro pores in the pad.

As illustrated in FIG. 2, the conditioner 10 includes a conditioner support member 11, multiple grains 7 disposed on the conditioner support member 11, and a plating layer 8 fixing the multiple grains 7 on the conditioner support member 11.

In a method of manufacturing such a conditioner, electrodeposition, fusing, or sintering techniques are used to fix grains 7 on a conditioner support member 11, and they grains comprise diamonds.

However, it is difficult to adjust distances between the grains because a mold is used, or the grains are distributed in the electrodeposition, fusing, and sintering methods. In addition, it is difficult to form uniformly protruding heights and portions of the grains.

BRIEF SUMMARY

Accordingly, the present disclosure has been made keeping in mind the above problems occurring in the related art, and an object of the present disclosure is to provide a method of manufacturing a chemical-mechanical polishing (CMP) pad conditioner used for pad conditioning, and a CMP pad conditioner manufactured thereby, which is configured such that three plating layers comprising a plating layer formed by reverse plating are formed to stably and uniformly support grains on a plane.

In order to accomplish the above objective, the present disclosure provides a method of manufacturing a pad conditioner by reverse plating, the method comprising: forming a first plating layer on a temporary substrate to have multiple recesses penetrating a first boundary layer; forming a second adhesive photosensitive film on the first plating layer; placing grains into the recesses; forming a first filling layer to have a first thickness smaller than a height of the first plating layer on the basis of the first boundary layer in order to support the grains; forming a second filling layer corresponding to the height of the first plating layer on the basis of the first filling layer in order to support the grains; removing the second adhesive photosensitive film and forming a second boundary layer on the entire surface; forming a second plating layer on the second boundary layer; removing the temporary substrate from the first boundary layer and attaching a final substrate to the second plating layer; removing the first boundary layer and the first plating layer; removing the second boundary layer excluding a portion not exposed to the outside by the second filling layer; and forming a third plating layer on an entire surface opposite to the final substrate to support the grains. Furthermore, the grains are fixed on and exposed over the final substrate by the coating layers formed in the order of the second plating layer formed of nickel, the second boundary layer formed of copper, and the third plating layer formed of palladium.

According to the present disclosure, grains can be exposed over a final substrate at a uniform height due to a plating layer formed by reverse plating.

In addition, a pad conditioner in which grains are arranged in various patterns can be manufactured by using compressive stress of palladium and tensile stress of nickel. That is, tensile stress is generated by a second filling layer comprising palladium to support the grains and compressive stress is generated by a first plating layer and a first filling layer comprising nickel to support the grains.

Therefore, according to the method of the present disclosure, it is possible to manufacture a pad conditioner faster when compared with the conventional method involving use of a mold, thereby shortening the manufacturing time. Bonding stability of the grains is enhanced by strengthened chemical stability and bonding strength obtained by the compressive stress of palladium around the grains fixed to the plating layer, whereby conditioning of a pad can be uniformly performed and the stability of the chemical-mechanical polishing (CMP) process can be improved.

BRIEF DESCRIPTION OF THE DRAWINGS

The above and other objects, features and advantages of the present disclosure will be more clearly understood from the following detailed description when read with reference to the accompanying drawings, in which.

DETAILED DESCRIPTION

Figure 1:
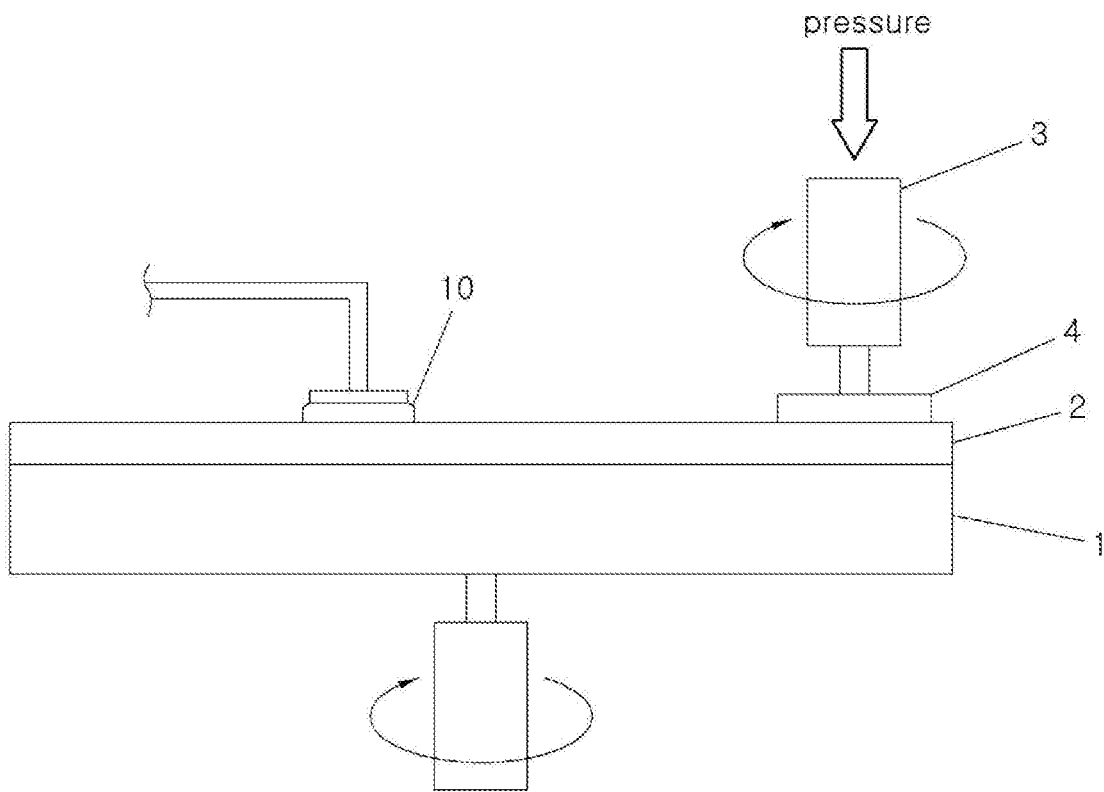
FIG. 1 is a schematic view illustrating a conventional configuration of a chemical-mechanical polishing (CMP) apparatus.
Figure 2:
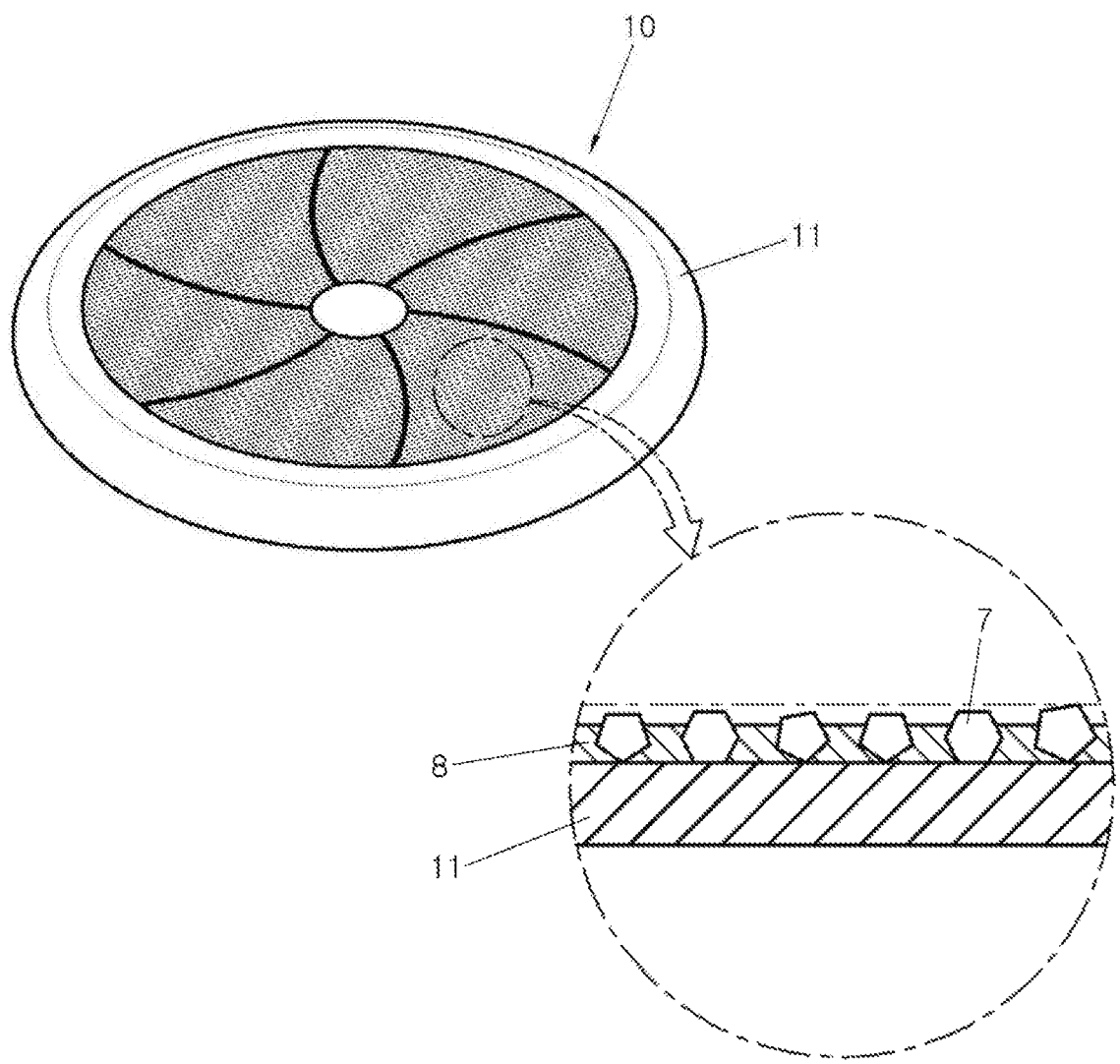
FIG. 2 illustrates a conventional pad conditioner.

An embodiment of the present disclosure will be described in detail below with reference to the accompanying drawings.

A manufacturing method of a pad conditioner according to the present disclosure is illustrated in FIGS. 3A-3L.

A first boundary layer 20 is formed on a temporary substrate 15 so as to coat at least a portion of a surface of the temporary substrate 15 with the first boundary layer 20. A first adhesive photosensitive film 32 is formed on the first boundary layer 20 and developed and patterned so as to form isolated regions of the first adhesive photosensitive film 32 on the first boundary layer 20. A first plating layer 34 is formed on the exposed regions of the first boundary layer 20 not covered by the isolated regions of the first adhesive photosensitive film 32, and the first adhesive photosensitive film 32 is removed to define recesses 33.

Specifically, in a first step S1, the first boundary layer 20 is formed on the temporary substrate 15, and the first adhesive photosensitive film 32 is formed on the first boundary layer 20. The material forming the first boundary layer 20 may comprise copper. The temporary substrate is removed and replaced with a final substrate in a later step, which will be described later.

In a second step S2, the first plating layer 34 is formed on the entire surface of the temporary substrate 15 such that the first plating layer 34 coats the surface excluding portions where the first adhesive photosensitive film 32 remains, and when removing the first adhesive photosensitive film 32, the recesses 33 are formed at positions where the photosensitive film was previously disposed. The first plating layer 34 may comprise nickel.

In order to cause the grains to stand up on the temporary substrate, the recesses 33 capable of accommodating grains are formed. For this purpose, the first boundary layer 20 is formed on the temporary substrate 15 such that the grains can be supported without coming into contact with the temporary substrate.

Therefore, after the first step S1 in which the first boundary layer 20 is formed on the temporary substrate 15 and the first adhesive photosensitive film 32 is formed thereon, the second step S2 is performed such that the first adhesive photosensitive film 32 is removed and thus multiple recesses 33 are formed.

In a third step S3, a second adhesive photosensitive film 44 is formed on the first plating layer 34 in a coated manner. A dry film resist (DFR) may be used as both the first and second adhesive photosensitive films.

In order to form the second adhesive photosensitive film 44 only on the first plating layer 34, the regions of the first boundary layer 20 exposed within the recesses 33 may require an additional measure.

In a fourth step S4, after forming the second adhesive photosensitive film 44 on the first plating layer 34, each grain 35 is placed into a respective recess 33, and a first filling layer 36 for fixing the grains is formed such that each grain is stood up and fixed in each recess 33.

In advance of forming of the first filling layer 36, a hole having a predetermined size may be provided to easily mount a pointed portion, i.e., the center portion, of the grain to be mounted in the recess.

The first filling layer 36 is shorter in height above the first boundary layer 20 than the first plating layer 34 because the first filling layer 36 is thinner than the first plating layer 34. The first filling layer 36 may be made of the same material as the first plating layer 34. The first filling layer 36 and the first plating layer 34 may include nickel. The thickness of the first filling layer 36 is referred to as a first thickness.

After forming the first filling layer 36, in a fifth step S5, a second filling layer 38 is formed inside the recesses 33 for fixing the grains 35 in position.

The second filling layer 38 is formed on the first filling layer 36 and does not reach an end of each grain 35. The height at which the first filling layer 36 and the second filling layer 38 fix the grains 35 for standing up of the grains 35 above the first boundary layer 20 is the same as the height of the first adhesive photosensitive film 32 and the height of the first plating layer 34 above the first boundary layer 20.

After forming the second filling layer 38 for standing up of grains 35, in a sixth step S6, the second adhesive photosensitive film 44 is removed and a second boundary layer 50 is formed in a coated manner. The second boundary layer 50 covers the entire first plating layer 34 and the second filling layer 38 to prevent the first plating layer 34 and the second filling layer 38 from being exposed to the outside. The second boundary layer 50 may be made of the same material as the first boundary layer 20 and may include copper.

In a seventh step S7, a second plating layer 60 is formed on the second boundary layer 50 in a coated manner. The second plating layer 60 is configured to cover both the second boundary layer and the grains 35 in a coated manner.

In an eighth step S8, the temporary substrate 15 is removed.

In a ninth step S9, a final substrate 70 is attached to the second plating layer 60. That is, the final substrate is attached to the opposite surface instead of the surface where the temporary substrate was removed.

In the ninth step S9, the grains 35 and the substrate are flipped over from the orientation in the previous steps to prepare performing of reverse plating. The reverse plating refers to a process in which plating is performed in a state in which the grains and the substrate are flipped over.

Before performing reverse plating, in a tenth step S10, the first boundary layer 20 and the first plating layer 34 are removed before the subsequent plating process. In an eleventh step S11, the second boundary layer 50 is removed. In the eleventh step S11, a part of the second boundary layer 50 disposed between the second filling layer 38 and the second plating layer 60 is not removed.

Therefore, the grains 35 in the eleventh step S11 are fixed by the second boundary layer 50 and the second filling layer 38. In other words, the grains 35 are fixed by the part of the second boundary layer 50, which is not removed because the part of the second boundary layer 50 is disposed between the second filling layer 38 and the second plating layer 60. Meanwhile, the first filling layer 36 may be made of the same material as the first plating layer 34, and the second filling layer 38 may be formed of palladium.

Figure 3A:
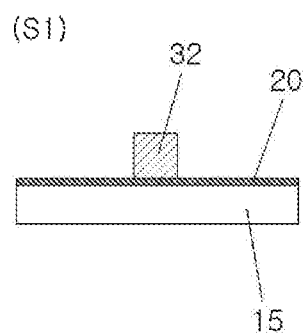
FIGS. 3A-3L illustrate a process for manufacturing a pad conditioner according to an embodiment of the present disclosure.
Figure 3B:
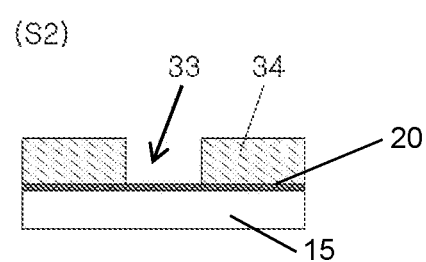
Figure 3C:
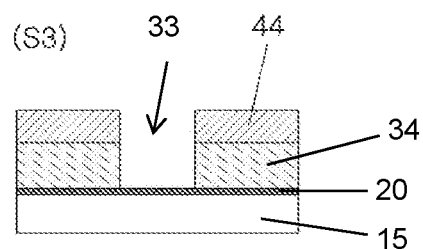
Figure 3D:
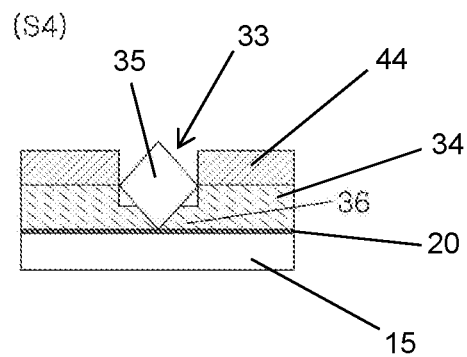
Figure 3E:
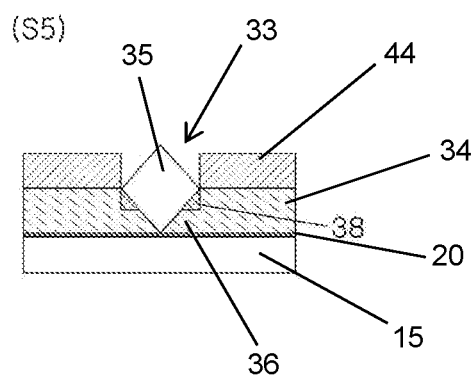
Figure 3F:
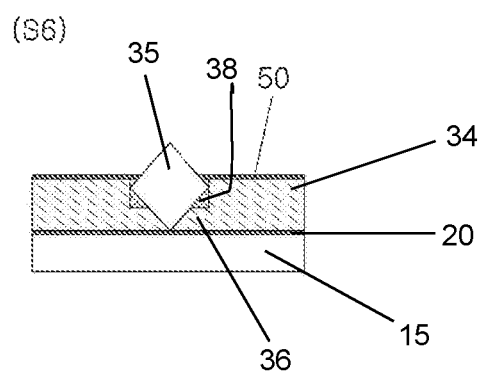
Figure 3G:
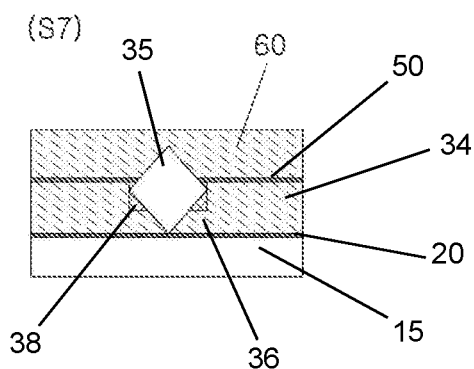
Figure 3H:
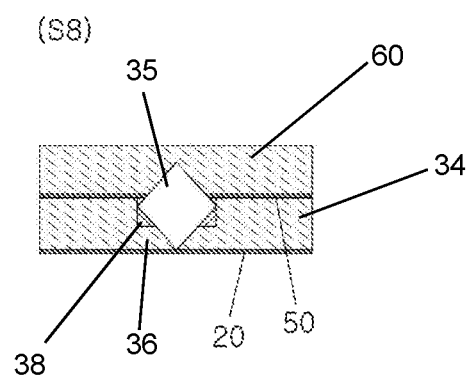
Figure 3I:
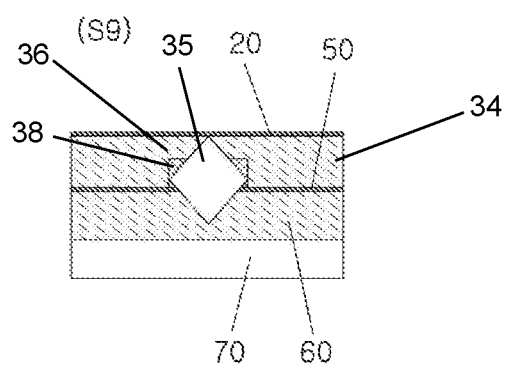
Figure 3J:
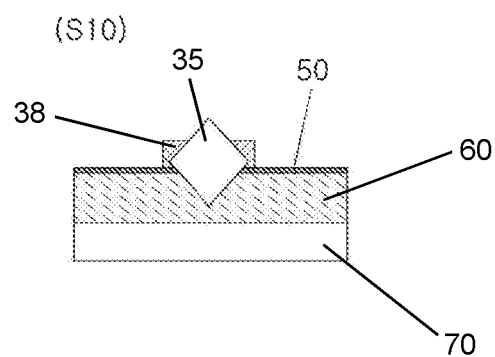
Figure 3K:
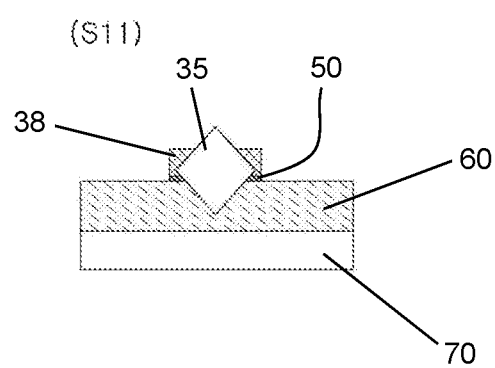
Figure 3L:
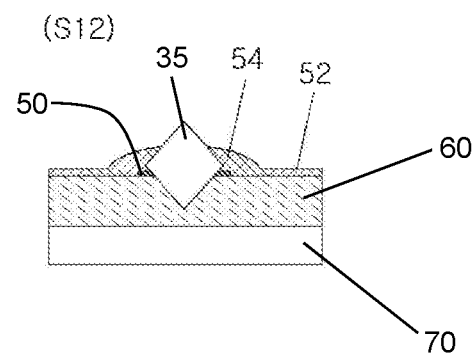

In a twelfth step S12, third plating layers 52 and 54 are formed on the entire surface in a coated manner. That is, the drawing illustrating the step S12 of FIG. 3L is a cross-sectional view illustrating the standing shape of the grain 35. A dome shape is formed in the periphery of the grain 35, and the remaining portion is flat. A dome-shaped third plating layer 54 is configured to be wider than the recess 33 in width such that the grains 35 can be stably fixed. The third plating layer around the grains 35 and the third plating layer on an upper surface of the second plating layer 60 are different in thickness. The third plating layer 52 on the upper surface of the second plating layer 60 has a constant thickness but the third plating layer 54 around the grains 35 has a thickness greater than the third plating layer 52.

Accordingly, the grains 35 are stood up on the final substrate by the coating layers formed in the order of the second plating layer 60 formed of nickel, the second boundary layer 50 formed of copper, and the third plating layers 52 and 54 formed of palladium.

Although the preferred embodiments of this disclosure have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a pad conditioner, the method comprising:

forming a first plating layer on a temporary substrate having multiple recesses exposing a first boundary layer on the temporary substrate by using a first adhesive photosensitive film;

forming a second adhesive photosensitive film on the first plating layer;

placing grains into the recesses;

forming a first filling layer to have a first thickness smaller than a height of the first plating layer over the first boundary layer in the recesses to support the grains;

forming a second filling layer corresponding to the height of the first plating layer over the first filling layer in the recesses to support the grains;

removing the second adhesive photosensitive film and forming a second boundary layer on an entire surface of the first plating layer;

forming a second plating layer on the second boundary layer;

removing the temporary substrate from the first boundary layer and attaching a final substrate to the second plating layer;

removing the first boundary layer and the first plating layer;

removing the second boundary layer excluding a portion disposed between the second filling layer and the second plating layer; and forming a third plating layer on an entire surface opposite to the final substrate to support the grains.

2. The method of claim 1, wherein the first plating layer and the second plating layer comprise the same material.

3. The method of claim 2, wherein the material of the first plating layer and the second plating layer comprises nickel.

4. The method of claim 1, wherein forming the third plating layer on the entire surface opposite to the final substrate comprises partially removing the third plating layer around the grains so as to expose upper portions of the grains.

5. The method of claim 1, wherein the third plating layer comprises palladium.

6. The method of claim 1, wherein the first and second boundary layers comprise copper.

\* \* \* \* \*